United States Patent
Kido et al.

(10) Patent No.: US 6,478,836 B1
(45) Date of Patent: *Nov. 12, 2002

(54) CERIUM OXIDE SLURRY FOR POLISHING, PROCESS FOR PREPARING THE SLURRY, AND PROCESS FOR POLISHING WITH THE SLURRY

(75) Inventors: Takanori Kido; Masayuki Sanbayashi; Fumio Tsujino; Kagetaka Ichikawa, all of Shiojiri (JP)

(73) Assignee: Showa Denko K.K., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/578,481

(22) Filed: May 26, 2000

Related U.S. Application Data

(63) Continuation-in-part of application No. PCT/JP99/07166, filed on Dec. 21, 1999.
(60) Provisional application No. 60/136,371, filed on May 26, 1999.

(30) Foreign Application Priority Data

Dec. 21, 1998 (JP) .............................. 10-362707
Nov. 22, 1999 (JP) .............................. 11-331107

(51) Int. Cl.[7] .............................. C09K 3/14; C09G 1/02
(52) U.S. Cl. .............................. 51/309; 106/3; 438/692; 438/693; 451/36
(58) Field of Search .............................. 51/309; 103/3; 438/692, 693; 451/36; 423/263

(56) References Cited

U.S. PATENT DOCUMENTS 4,769,076 A * 9/1988 Tastu et al. .................... 51/309
5,266,088 A * 11/1993 Sandusky et al. ............. 51/309
5,643,406 A * 7/1997 Shimomura et al. ......... 438/693

FOREIGN PATENT DOCUMENTS

EP 0 266 233 5/1988 ............ C09K/3/14

* cited by examiner

*Primary Examiner*—Michael Marcheschi
(74) *Attorney, Agent, or Firm*—Sughrue Mion, PLLC

(57) ABSTRACT

A cerium oxide slurry for polishing comprising cerium oxide dispersed in water, wherein the slurry has a conductivity of about 30 c $\mu$S/cm or less when the cerium oxide concentration in the slurry is c wt. %. In order to adjust the conductivity to about 30 c $\mu$S/cm or less, cerium oxide is washed with deionized water.

8 Claims, No Drawings

CERIUM OXIDE SLURRY FOR POLISHING, PROCESS FOR PREPARING THE SLURRY, AND PROCESS FOR POLISHING WITH THE SLURRY

CROSS-REFERENCE TO THE RELATED APPLICATION

This application is entitled to the benefit of the priority based on U.S. Provisional application No. 60/136,371, filed on May 26, 1999. This application is a CIP of PCT/JP99/07166, filed Dec. 21, 1999, which claims priorities on Japanese Application 10-362707 filed Dec. 21, 1998 and Japanese Application 11-331107 filed Nov. 22, 1999.

TECHNICAL FIELD

The present invention relates to a cerium oxide slurry for polishing, and more particularly, to a cerium oxide slurry for polishing a glass article such as a photomask or a lens, or an insulating film during a step in the manufacture of a semiconductor device. The cerium oxide slurry of the present invention provides a high polishing rate with a finished surface having very few defects. The present invention also relates to a process for preparing the cerium oxide slurry and a process for polishing with the slurry.

BACKGROUND OF THE INVENTION

In the field of manufacturing semiconductor devices, polishing technique has been proposed and earnestly studied in order to address a variety of issues such as demand for attaining a focus depth in a photolithography step, which is required along with enhancement of the degree of integration of a semiconductor device and increase in the number of layers in a multi-layer device.

Application of a polishing technique to manufacture of a semiconductor device has been developed furthest in relation to a step of planarizing an insulating film. In this polishing, an alkaline suspension obtained through dispersion of fumed silica in water is predominantly used as an abrasive.

Meanwhile, a cerium oxide abrasive has been practically used for polishing a glass product such as a photomask or a lens, and application of the cerium oxide abrasive is proposed for planarizing of an insulating film made of a silicon-dioxide-based material which is substantially equivalent to glass.

Japanese unexamined Patent Publication (kokai) No. 5-326469 discloses a technique for polishing an insulating film by use of an abrasive composition containing cerium oxide. It also describes that the technique has enabled planarization of steps based on the configuration of polysilicon or other wiring or interconnection, and a maximum size of cerium oxide particles is preferably 4 $\mu$m or less, in consideration of minimizing generation of flaws.

Japanese Unexamined Patent Publication (kokai) No. 6-216096 discloses that use of high-purity cerium oxide containing a trace element other than Ce and O in an amount of 100 ppm or less is advantageous for preventing contamination of a wafer.

Japanese Patent No. 2592401 discloses polishing of an insulating film with abrasive grains comprising, in predetermined amounts, cerium oxide "OPALINE" having a particle size of 300–500 nm, fumed silica, and precipitated silica, to thereby provide excellent surface flatness.

Japanese Unexamined Patent Publication (Kohyo) No. 8-501768 discloses that sub-micron cerium oxide particles are obtained through a process comprising two steps: (a) forming an aqueous solution comprising a water-soluble trivalent cerium salt and an oxidizing agent and (b) aging the solution for four hours or longer, the solution being maintained in a liquid state.

Japanese Unexamined Patent Publication (kokai) No. 8-153696 discloses that an organic or inorganic insulating film is polished with cerium oxide particles having a crystalite size of 30 nm or less or 60 nm or more while the pH of a abrasive solution is controlled.

Japanese Unexamined Patent Publication (kokai) No. 9-82667 discloses an abrasive composition comprising a plurality of cerium oxide particle grains having average crystallite sizes that differ from one another.

Japanese Unexamined Patent Publication (kokai) No. 8-134435 discloses that an abrasive used in a manufacturing step of a semiconductor device, which comprises cerium oxide having an average primary-particle size of 0.1 $\mu$m or less as measured under an SEM (scanning electron microscope).

Japanese Patent No. 2746861 discloses a process for producing ultramicro particles of cerium oxide single crystal having a particle size of 10–80 nm, which ultramicro particles can be used in manufacture of a semiconductor device.

Japanese Unexamined Patent Publication (kokai) No. 8-3541 discloses an abrasive composition for precise polishing which comprises an alkaline ceric oxide sol containing an organic acid having two or more carboxyl groups. The average particle size, as measured through a dynamic light scattering method, must fall within the range of 2 nm to 200 nm.

Japanese unexamined Patent Publication (kokai) No. 8-81218 discloses an aqueous dispersion of ceric oxide particles having an average particle size, as measured by use of an apparatus for measuring particle size distribution based on centrifugal sedimentation, of 0.03–5 $\mu$m, as well as a process for producing the dispersion, The dispersion is also applicable to manufacture of a semiconductor device.

An article in "*Denshi Zairyo* (Electronic Material)" 1997, May, p. 113 and on discloses basic polishing performance of cerium oxide having an average particle size of 0.5 $\mu$m, as measured through a laser diffraction method.

As described above, an abrasive comprising cerium oxide finding a possible use in planarizing an insulating film has been studied extensively. However, practical use thereof in this field has not yet been attained. This is due to difficulty in simultaneously achieving minimization of defects on a finished surface and a high polishing rate of an insulating film typically formed of a silicon dioxide film.

Production processes for an abrasive comprising cerium oxide for polishing an insulating film in manufacture of a semiconductor device that have been studied are roughly divided into two types. One is a firing process which comprises firing a cerium compound such as cerium carbonate or cerium oxalate so as to produce cerium oxide, and typically crushing the resultant cerium oxide to make the particle size appropriate for use as an abrasive. The other is a wet synthesis process which comprises mixing an aqueous solution of a water-soluble cerium compound such as cerium nitrate and an aqueous alkaline solution such as aqueous ammonia to thereby produce a gelatinous slurry containing cerium hydroxide and typically aging the resultant slurry at 80–300° C.

The thus-produced conventional cerium oxide slurry has a conductivity in the deaerated state (in this specification a conductivity in the deaerated state is referred to simply as "conductivity") of 400 μS/cm or more (the letter "S" stands for the unit "Siemens"), typically 600 μS/cm or more, when the slurry has a concentration of 10 wt. %. Since the correlation between the conductivity of a slurry and the polishing rate is not recognized, it is difficult to simultaneously achieve minimization of defects on a finished surface and a high polishing rate of an insulating film typically formed of a silicon dioxide film, as described above.

The conductivity of a slurry increases with the concentration of an ionic substance contained in the slurry, and therefore, conductivity serves as an index for the concentration of the ionic substance. A conventional cerium oxide slurry contains ionic impurities originating from a cerium oxide source, and ionic impurities are by-produced during the wet synthesis process. Such impurities elevate the conductivity of a slurry. In addition, a variety of ionic substances, such as a dispersant and a pH-adjusting agent, are typically added to a slurry for polishing, and these additives further elevate the conductivity of the slurry.

In view of the foregoing, an object of the present invention is to provide a cerium oxide slurry for polishing which simultaneously achieves a high polishing rate and minimization of defects on a finished surface after polishing to a level allowing practical use.

DISCLOSURE OF THE INVENTION

The present inventors have conducted earnest studies in order to solve the above-described problems, and have found that the problems can be solved through a decrease in the concentration of an ionic substance contained in a slurry; i.e., lowering of the conductivity of the slurry.

Accordingly, the present invention includes the following:

(1) A cerium oxide slurry for polishing, which slurry comprises cerium oxide dispersed in water, wherein the slurry has a conductivity of about 30 c μS/cm or less when the concentration of cerium oxide in the slurry is c wt. %.

(2) A cerium oxide slurry for polishing according to (1), wherein the slurry has a conductivity of about 10 c μS/cm or less when the concentration of cerium oxide in the slurry is c wt. %.

(3) A cerium oxide slurry for polishing according to (1) or (2), wherein cerium oxide has a purity of about 99 wt. % or more.

(4) A cerium oxide slurry for polishing according to (1)–(3), wherein the specific surface area of cerium oxide as measured by a BET method is in a range of about 5 m²/g to about 100 m²/g.

(5) A cerium oxide slurry for polishing according to (1)–(4), wherein the maximum particle size of cerium oxide is about 10.0 μm or less as measured through a dynamic light scattering method.

(6) A process for producing a cerium oxide slurry for polishing, said slurry comprising cerium oxide dispersed in water, which process comprises the steps of washing cerium oxide with deionized water, and dispersing the thus-washed cerium oxide in water to form a slurry, thereby controlling the conductivity of the slurry to about 30 c μS/cm or less when the concentration of cerium oxide in the slurry is c wt. %.

(7) A process for producing a cerium oxide slurry for polishing, according to (6), wherein the conductivity of the slurry is controlled to about 10 c μS/cm or less when the concentration of cerium oxide in the slurry is c wt. %.

(8) A process for producing a cerium oxide slurry for polishing, said slurry comprising cerium oxide dispersed in water, which process comprises the steps of washing cerium oxide with deionized water, drying the washed product with heat, and dispersing the thus-washed cerium oxide in water to form a slurry, thereby controlling the conductivity of the slurry to about 30 c μS/cm or less when the concentration of cerium oxide in the slurry is c wt. %.

(9) A process for producing a cerium oxide slurry for polishing, according to (8), wherein the conductivity of the slurry is controlled to about 10 c μS/cm or less when the concentration of cerium oxide in the slurry is c wt. %.

(10) A polishing method which comprises polishing an object to be polished by use of a cerium oxide slurry for polishing as recited in any one of claims 1 through 5.

(11) A polishing method according to (10), wherein said object to be polished is an insulating film in a semiconductor device.

(12) A polishing method according to (11), wherein said insulating layer is based on silicon oxide and is planarized by polishing.

BEST MODE FOR CARRYING OUT THE INVENTION

No particular limitation is imposed on the cerium oxide used in the present invention, and the cerium oxide may be that produced through a known method such as the above-described firing process or wet-synthesis process.

The cerium oxide per se preferably has a purity of about 99 wt. % or more. If the purity of the cerium oxide is low, contamination of a semiconductor device with a metallic impurity derived from the residual cerium oxide abrasive particles is not minimized after the semiconductor device is polished with a cerium oxide abrasive and washed.

In order to assure the polishing rate of an insulating film, cerium oxide particles preferably have a BET specific surface area of about 100 m²/g or less, more preferably about 50 m²/g or less; whereas in order to surely prevent generation of defects, cerium oxide particles preferably have a BET specific surface area of about 5 m²/g or more, more preferably about 8 m²/g or more.

In addition, in order to surely prevent generation of defects, cerium oxide particles preferably have a maximum particle size, as measured through a dynamic light scattering method, of about 10.0 μm or less, more preferably about 5.0 μm or less, still more preferably about 2.0 μm or less.

The cerium oxide slurry for polishing of the present invention has a conductivity of about 30 c μS/cm or less, preferably about 10 c μS/cm or less, when the concentration of the slurry is c wt. %

During measurement of the conductivity of a slurry, the slurry must be sufficiently deaerated so as to prevent variation of conductivity caused by a dissolved gas such as carbon dioxide. Deaerating may be carried out through bubbling with an inert gas such as $N_2$.

The cerium oxide slurry for polishing of the present invention may be used as such or diluted with water or with an aqueous solution. For example, when a slurry has a cerium oxide concentration of about 10 wt. %, the slurry has a conductivity of about 300 μS/cm or less, preferably about 200 μS/cm or less, more preferably about 100 μS/cm or less.

Although the conductivity of a slurry serves as an index of cleanliness of the surface of cerium oxide particles, the concentration of cerium oxide in the slurry must be taken into account. In general, when a slurry is diluted with ionized water, dilution of the slurry is inversely proportional to the conductivity of the slurry. Thus, when the concentration of cerium oxide in the slurry is c wt. %, the conductivity should be about 30 c $\mu$S/cm or less, preferably about 20 c $\mu$S/cm or less, more preferably about 10 c $\mu$S/cm or less.

If the conductivity exceeds about 30 c $\mu$S/cm, an ionic substance serving as an impurity covers the surface of cerium oxide particles, to thereby affect polishing performance of cerium oxide particles and lower the polishing rate.

The slurry preferably has a cerium oxide concentration of about 0.1–30 wt. % during actual application. If the concentration is less than about 0.1 wt. %, the polishing rate is poor; whereas if the concentration exceeds about 30 wt. %, an effect commensurate with the increase in concentration is not obtained, and such a slurry is economically disadvantageous.

Although the relationship between conductivity and polishing rate discovered by the present inventors is not completely elucidated, the inventors theorize the relationship to be as follows.

The supposed reason why silicon dioxide material can be effectively polished by use of cerium oxide, widely accepted, resides in that the polishing is based on interaction or chemical reaction between the surface of cerium oxide particles and the surface to be polished. Thus, when the surface of cerium oxide particles is clean, a high polishing rate should be attained. In a conventional cerium oxide slurry, however, the surface of cerium oxide particles is contaminated with the above-described ionic impurity, and polishing performance provided by cerium oxide is considered to be inhibited. In contrast, in the present invention, the conductivity of a slurry is controlled to under a specific level, to thereby suppress contamination on the surface of cerium oxide particles to a predetermined level. Thus, cerium oxide particles provide sufficient polishing performance and provide a polishing rate higher than that provided by a conventional cerium oxide slurry.

The process for producing the cerium oxide slurry for polishing will next be described.

The cerium oxide slurry of the present invention has a conductivity controlled to the above-described value or less, which is obtained through removal of an ionic substance; i.e., sufficient washing of cerium oxide with deionized water. For example, washing is carried out in the steps of dispersing cerium oxide particles in deionized water and dissolving an ionic substance into the water; separating cerium oxide from the water through a method such as ultrafiltration, filter-pressing, or centrifugal sedimentation; and adding deionized water to the thus-separated cerium oxide, to thereby remove from the system the ionic substance as described above. Deionized water is optionally added to the thus-separated cerium oxide, and the above step may be repeated. Deionized water employed in the steps preferably has a conductivity of about 0.1 $\mu$S/cm or less.

The thus-washed cerium oxide may be dried with heat, and deionized water is again added thereto to thereby form a slurry. Examples of the method for drying include evaporating the slurry after washing to dryness; further heating the above-evaporation dried product; and drying, with heat, cerium oxide particles separated through filtration, etc. following washing. The heating temperature is approximately 100–300° C. Drying with heat is effective for removing a volatile ionic substance such as an organic substance.

After removal of an ionic substance from the system as described above, a cerium oxide slurry for polishing is prepared through adjustment of the concentration of cerium oxide. The slurry may have a high concentration of cerium oxide for later dilution with water or an aqueous solution before use, or have a concentration for use as such.

When the slurry is used with dilution, it is most preferably diluted with deionized water. However, the slurry may alternatively be diluted with an aqueous solution containing any of a variety of ionic or nonionic substances or solid abrasive particles other than cerium oxide particles may also be added in accordance with an object, so long as the preferred effects of the present invention are realized. When the slurry is diluted with an aqueous solution containing an ionic substance, the conductivity of the diluted slurry is adjusted so as not to fall beyond the range according to the invention.

Examples of the material to be polished by the cerium oxide slurry of the present invention include a glass product such as a photomask or a lens, and an insulating film formed in a manufacturing step of a semiconductor device. Particularly when the insulating film is formed of silicon dioxide or the like, excellent polishing results can be obtained. The insulating layer may be $SiO_x$, formed by CVD, PVD, spin-on-glass (SOG) etc., which are known in the field of semiconductor devices.

Polishing is carried out in a customary manner. For example, the slurry is fed between a material to be polished and a pad, and the material is rotated.

EXAMPLES

The present invention will next be described in detail by way of examples, which should not be construed as limiting the invention thereto.

Example 1

Cerium oxide having a purity of 99.95 wt. % was crushed in a nylon pot by use of nylon balls, to thereby obtain cerium oxide powder having a BET specific surface area of 12 m²/g. The powder was dispersed in deionized water (conductivity 0.05 $\mu$S/cm), to thereby prepare a suspension slurry. The concentration of cerium oxide in the slurry was 17 wt. %. The conductivity of the cerium oxide slurry was 220 $\mu$S/cm as measured by use of a conductivity meter (Type ES-12, product of Horiba, Ltd.).

The slurry was separated through centrifugal sedimentation. Subsequently, the supernatant was removed and deionized water was added to the sediment. The procedure was repeated, to thereby obtain a slurry having a cerium oxide concentration of 10 wt. % and a conductivity of 45 $\mu$S/cm. The maximum particle size as measured through a dynamic light scattering method (Microtruck particle size analyzer UPA 9340) was 0.9 $\mu$m.

The thus-obtained slurry was diluted with deionized water for 10-fold dilution, to thereby yield a slurry having a cerium oxide concentration of 1 wt. % and a conductivity of 4.3 $\mu$S/cm. The polishing performance of the slurry to a silicon dioxide film was evaluated in a manner described below.

(Polishing conditions)
Test piece to be polished:
  A silicon dioxide film (thickness approximately 1 $\mu$m) formed on a silicon wafer (6 inches $\phi$, thickness 625 $\mu$m) through thermal oxidation.
Pad: Two-layer polishing Pad for LSI devices
  (IC 1000/Suba 400, product of Rodel).

Polishing machine:
   One-side polishing machine for LSI devices (Model SH-24, table plate size: 610 mm; manufactured by Speedfam, Inc.)
Table rotation: 70 rpm
working pressure: 300 gf/cm² (2.94 N/cm²)
Slurry feed rates: 100 ml/min
Polishing time: 1 min
   (Evaluation items and methods)
Polishing rate:
   Film thickness measuring (optical interference color method) apparatus, calculated from a polish amount divided by a polishing time.
Defects: Microscopic observation in the dark (focus magnitude of ×200), observation for a 3% of the surface area of the wafer, reduced to the number of detected defects per surface.

The results in the above polishing test revealed that the polishing rate was as high as 6130 angstroms/minute and the number of detected defects was two, which is excellent because it corresponds to 67/surface as reduced to the overall surface of a 6-inch wafer.

Example 2

A slurry having a concentration of cerium oxide of 10 wt. % and a conductivity of 45 $\mu$S/cm, prepared in Example 1, was evaporated to dryness in a porcelain mortar. The dried product was further dried at 200° C. to thereby remove water and a volatile substance. The resultant dried solid was crushed in an agate mortar and suspended in ionized water. The suspension was subjected to ultrasonic treatment for 30 minutes, to thereby produce a slurry having a cerium oxide concentration of 10 wt. %. The slurry had a conductivity of 22 $\mu$S/cm and a maximum particle size of 1.7 $\mu$m as measured through a dynamic light scattering method.

The thus-obtained slurry was diluted with deionized water for 10-fold dilution, to thereby yield a slurry having a cerium oxide concentration of 1 wt. % and a conductivity of 1.9 $\mu$S/cm. The polishing performance of the slurry to a silicon dioxide film was evaluated in a similar manner as described in Example 1. The results revealed that the polishing rate was as high as 7810 angstroms/minute and the number of detected defects was 67/surface, which was excellent.

Example 3

A slurry having a cerium oxide concentration of 17 wt. % and a conductivity of 220 $\mu$S/cm, prepared in Example 1, was diluted with deionized water, to thereby obtain a slurry having a cerium oxide concentration of 10 wt. %. The slurry had a conductivity of 160 s/cm and a maximum particle size of 0.9 $\mu$m as measured through a dynamic light scattering method.

The thus-obtained slurry was further diluted with deionized water for 10-fold dilution, to thereby yield a slurry having a cerium oxide concentration of 1 wt. % and a conductivity of 16 $\mu$S/cm. The polishing performance of the slurry to a silicon dioxide film was evaluated in a similar manner as described in Example 1. The polishing rate was 5100 angstroms/minute. However, the number of detected defects was 67/surface, which was satisfactory.

Comparative Example 1

In a manner similar to that described in Example 1, cerium oxide having a purity of 99.95 wt. % was crushed in a nylon pot by use of nylon balls, to thereby obtain cerium oxide powder having a BET specific surface area of 12 m²/g. The powder was dispersed in deionized water, to thereby prepare a cerium oxide slurry having a concentration of 1 wt. %. The slurry had a conductivity of 40 $\mu$S/cm and a maximum particle size as measured through a dynamic light scattering method of 0.9 $\mu$m. The polishing performance of the slurry to a silicon dioxide film was evaluated in a manner similar to that described in Example 1. The polishing rate was 4200 angstroms/minute, which was low as compared with that of the slurry of the present invention. However, the number of detected defects was 67/surface, which was satisfactory.

Comparative Example 2

Fumed silica slurry (SC-1, product of Cabot, 30 wt. %) was diluted with deionized water, to thereby obtain a slurry having a cerium oxide concentration of 10 wt. % and a pH of 10.3. The slurry had a conductivity as high as 900 $\mu$S/cm, because it contained KOH serving as a pH-adjusting agent. The slurry had a maximum particle size of 0.5 $\mu$m as measured through a dynamic light scattering method.

The polishing performance of the slurry to a silicon dioxide film was evaluated in a similar manner as described in Example 1. The polishing rate was as low as 1300 angstroms/minute. However, the number of detected defects was 67/surface, which was satisfactory.

The results of Examples 1, 2, and 3 and Comparative Examples 1 and 2 are shown in Table 1.

TABLE 1

|  | Abrasive | Concentration of abrasive (wt. %) | Conductivity ($\mu$S/cm) | Maximum particle size ($\mu$m) | Polishing rate (Å/min) | Defects (/surface) |
|---|---|---|---|---|---|---|
| Ex. 1 | Cerium oxide | 1 | 4.3 | 0.9 | 6130 | 67 |
| Ex. 2 | Cerium oxide | 1 | 1.9 | 1.7 | 7810 | 67 |
| Ex. 3 | Cerium oxide | 1 | 16 | 0.9 | 5100 | 67 |
| Comp. Ex. 1 | Cerium oxide | 1 | 40 | 0.9 | 4200 | 67 |
| Comp. Ex. 2 | Silica | 10 | 900 | 0.5 | 1300 | 67 |

INDUSTRIAL APPLICABILITY

The cerium oxide slurry for polishing of the present invention is useful in industry including particularly a semiconductor device manufacture, since it provides a finished surface having very few defects even when polishing is performed at a high polishing rate in polishing a glass article such as a photomask or a lens and polishing an insulating film during a manufacturing step of semiconductor devices.

What is claimed is:

1. A cerium oxide polishing slurry comprising cerium oxide dispersed in water, wherein the slurry has a conductivity of about 30 c $\mu$S/cm or less when the concentration of cerium oxide in the slurry is c wt. %.

2. A cerium oxide slurry according to claim 1, wherein the slurry has a conductivity of about c $\mu$S/cm or less when the concentration of cerium oxide in the slurry is c wt. %.

3. A cerium oxide slurry according to claim 1, wherein cerium oxide has a purity of about 99 wt. % or more.

4. A cerium oxide slurry according to claim 1, wherein the specific surface area of cerium oxide as measured by a BET method is in a range of about 5 m²/g to about 100 m²/g.

5. A cerium oxide slurry according to claim 1, wherein the maximum particle size of cerium oxide is about 10.0 $\mu$m or less as measured through a dynamic light scattering method.

6. A polishing method which comprises polishing an object to be polished by using said cerium oxide slurry as recited in any one of claims 1 through 5.

7. A polishing method according to claim 6, wherein said object to be polished is an insulating film in a semiconductor device.

8. A polishing method according to claim 7, wherein said insulating film is based on silicon oxide and is planarized by polishing.

* * * * *

UNITED STATES PATENT AND TRADEMARK OFFICE
CERTIFICATE OF CORRECTION

PATENT NO. : 6,478,836 B1
DATED : November 12, 2002
INVENTOR(S) : Takanori Kido et al.

It is certified that error appears in the above-identified patent and that said Letters Patent is hereby corrected as shown below:

Column 8,
Line 58, change "c $\mu$S/cm" to -- 10 c $\mu$S/cm --.

Signed and Sealed this

Eighteenth Day of March, 2003

JAMES E. ROGAN
*Director of the United States Patent and Trademark Office*